United States Patent [19]

Ikeya et al.

[11] Patent Number: 5,020,998

[45] Date of Patent: Jun. 4, 1991

[54] TEST SOCKET

[75] Inventors: Kiyokazu Ikeya, Shizuoka; Masanori Yagi, Sagamihara, both of Japan

[73] Assignee: Texas Instruments Incorporated, Dallas, Tex.

[21] Appl. No.: 421,220

[22] Filed: Oct. 13, 1989

[30] Foreign Application Priority Data

Nov. 4, 1988 [JP] Japan ................. 63-280197

[51] Int. Cl.⁵ ............................................. H01R 11/22
[52] U.S. Cl. ..................................... 439/266; 439/73
[58] Field of Search .................. 439/70, 71, 72, 73, 439/152, 266, 268, 267, 330, 331

[56] References Cited

U.S. PATENT DOCUMENTS

| 4,341,429 | 7/1982 | Bright et al. | 439/268 |
| 4,715,823 | 12/1987 | Ezura et al. | 439/267 |
| 4,840,575 | 6/1989 | Matsuoka | 439/267 |
| 4,846,703 | 7/1989 | Matsuoka et al. | 439/266 |
| 4,846,704 | 7/1989 | Ikeya | 439/73 |

Primary Examiner—Larry I. Schwartz
Assistant Examiner—Hien D. Vu
Attorney, Agent, or Firm—James P. McAndrews; John A. Haug; Melvin Sharp

[57] ABSTRACT

A socket for testing integrated circuit units has contact elements and holding members movable on a body and has a cover reciprocable toward the body to move the contact elements and holding members in selected sequence for receiving an integrated circuit unit in a carrier on the body and away from the body to permit the holding members to engage the carrier and to permit the contact elements to engage terminals on the integrated circuit on the carrier for releasably connecting the terminals in a test circuit.

11 Claims, 5 Drawing Sheets

TEST SOCKET

BACKGROUND OF THE INVENTION

The invention relates to a socket for mounting an integrated circuit (IC) chip or unit for testing.

In the past, IC chips have been placed in a heating oven for determining if they are satisfactory under a heat resistance test called the burn-in test.

In a known socket for mounting an IC chip or unit for such a test, a large number of pin-shaped contact elements are provided on a main socket body and latches are provided for holding the IC chip on the body during testing. A carrier separate from the body, holds the IC chip for protection of the chip and the latches hold the carrier. However, the latching of the carrier is complicated and it is difficult to locate the carrier on the main socket body by use of automatic equipment or the like. Further, the carrier and the socket body tend to be considerably larger than the IC chip unit with the result that only a limited number of IC units can be tested with each test circuit board before replacement of the board becomes necessary. Such replacement results in significant time loss in the case of automated testing. There are various socket structures of this general type having latches of similar function in which a cover member moves up and down in such a manner as to surround an IC chip carrier but such known socket structures are also subject to the shortcomings noted above.

BRIEF SUMMARY OF THE INVENTION

It is an object of the invention to provide test sockets for integrated circuit units and the like which are easy and convenient to use and which are adapted to be accommodated with high density on test circuit boards.

Briefly described, a socket according to this invention comprises a contact element on a main socket body which is adapted to be electrically connected to an IC unit terminal in an elastically compressed state, a fixing or holding member which is adapted to hold or position the IC unit relative to the main socket body in such a manner that it is easily attachable and detachable to the IC unit or to a carrier for the IC unit, and a reciprocating cover member mounted on the body to permit reciprocating motion toward the body for moving the contact element and holding member from their original positions in selected sequence to allow insertion of the IC unit into the socket and to permit reciprocating motion away from the body to allow the holding member and contact element to be sequentially returned to their original locations to hold the IC unit on the body and to electrically connect a terminal of the IC unit in a test circuit.

DESCRIPTION OF THE DRAWINGS

Other objects, advantages and details of the socket of this invention appear in the following detailed description which refers to the drawings in which.

DESCRIPTION OF PREFERRED EMBODIMENTS OF THE INVENTION

Figure 1:
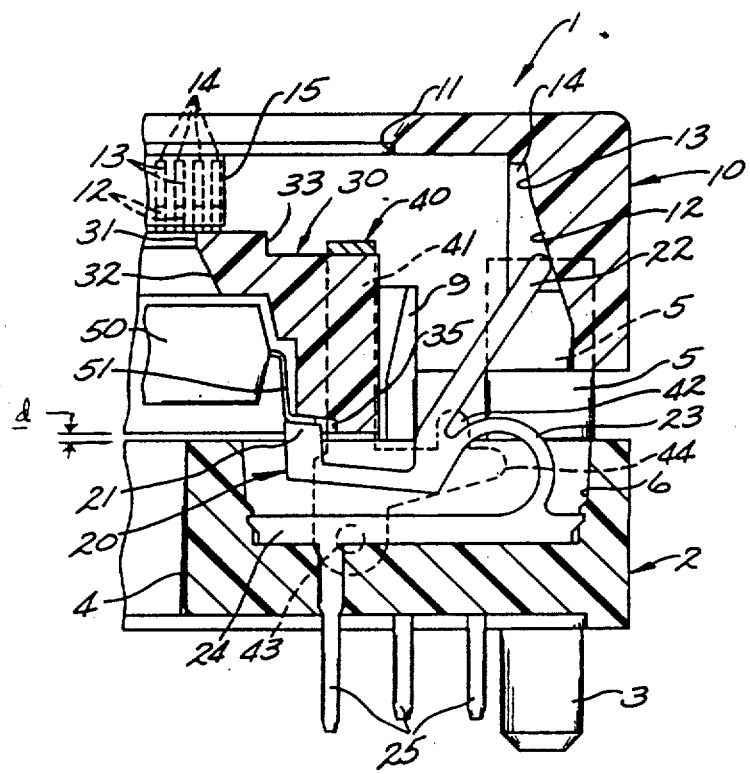
FIG. 1 is a partial cross section view to greatly enlarged scale along line I—I of FIG. 4 illustrating the socket of this invention.

Referring to the drawings, 1 in FIGS. 1-2 and 6-7 indicates the novel and improved socket of the invention which is shown to include a main socket body 2 of electrical insulating material having a plurality of contact elements 20 of electroconductive material mounted on the body, each contact element comprising a fixed part 24 mounted on the body, an integral post part 25 extending from the body, an elastic loop or bent part 23 extending from the fixed part and which has been satisfactorily bent in the shape of an arc extending from the fixed part 24, a sliding or trigger part 22, and a compressive part 21 that is located at a distal end of bent part 23.

A fixing or holding member 40 fixes a carrier 30 of electrical insulating material for installing and supporting an IC chip 50 on the base body 2, the holding member comprising a fixing lever part 41 (see FIG. 5) which is approximately in the shape of U as it stands erect from a support pin 43 (center of rotation) which is fixed to the main socket body 2, a connective part 44 which extends in a direction which is at a right angle as compared to the fixing or holding lever 41, and a protuberant part 42 which sticks out of this connective part 44 spaced to one side of the fixing lever 41.

A coil spring 45 is arranged in a concave part (not shown) formed in the main socket body 2 around the spring and an upper end of the spring 45 contacts the lower end of the connective part 44 on the holding member 40. (See FIG. 2)

Figure 2:
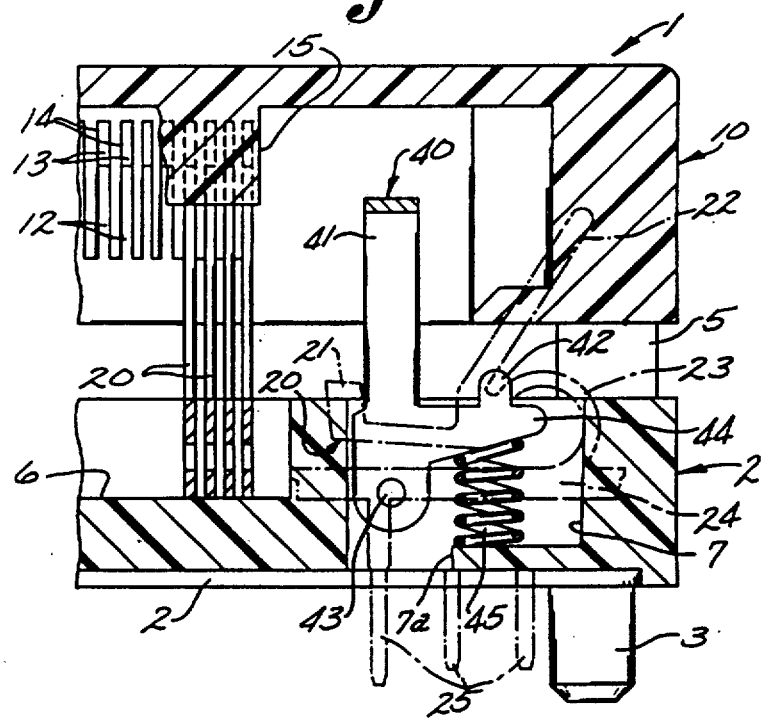
FIG. 2 is a partial cross section view similar to FIG. 1 along line II—II of FIG. 4.

Reference numeral 3 in the drawing indicates a leg on the socket body adapted for positioning or mounting the body 2 on a printed circuit board or the like as shown, 4 is a through hole in the body 2, 5 is a guiding post part upstanding from the body 2 to slidably receive a cover part or reciprocating member 10 described below, 6 and 7 are grooves in the body 2 used for receiving the contact elements 20 and the fixing member 40 respectively (a part of the groove 7 constituting a through hole 7a in the body 2 as shown in FIG. 2), 8 is a clearance or cut part (see FIGS. 4 and 5), and 9 is a partition plate upstanding from the body 2 for locating the carrier 30 at a prescribed location on the body 2.

In the cover part 10, there is a central opening 11 and there are grooves 14 for accommodating the insertion of the sliding or trigger parts 22 of the contact elements 20. In the grooves 14, there are provided two inclined surfaces 12 and 13 (sliding or cam surfaces for the sliding part 22 of the contact elements) whose angles of incline differ from each other.

In the cover part 10, further, the eaves or retention parts 15 (see FIG. 2) are provided in such a manner as to partially cover the grooves 14, one retention part 15 being located at each of the sides of the cover part so that the retention parts face each other around the opening 11. On one of these retention parts, there is provided a protuberant part 16 (see FIGS. 4-5) for cooperating with a slot 60 in a chip carrier 30 for positioning of a carrier 30 relative to the cover 10 as described below.

Not shown in the drawings are bores in the cover for slidably receiving the pins 5 and conventional detent parts are provided at four locations on the cover 10 and are engaged with corresponding parts of the main socket body such as the groove parts 7 to permit reciprocating movement of the cover on the body while preventing any inadvertent disengagement of the cover from the body.

Figure 3:
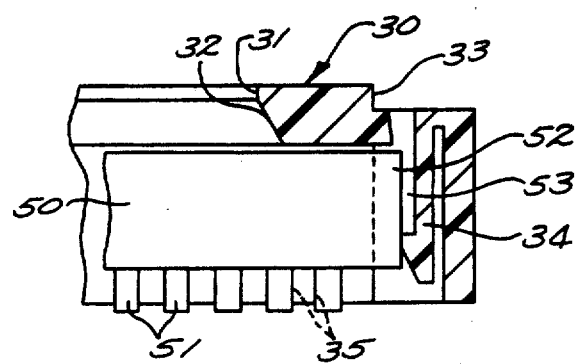
FIG. 3 is a partial section view to somewhat smaller scale than FIG. 1-2 along line III—III of FIG. 4.
Figure 4:
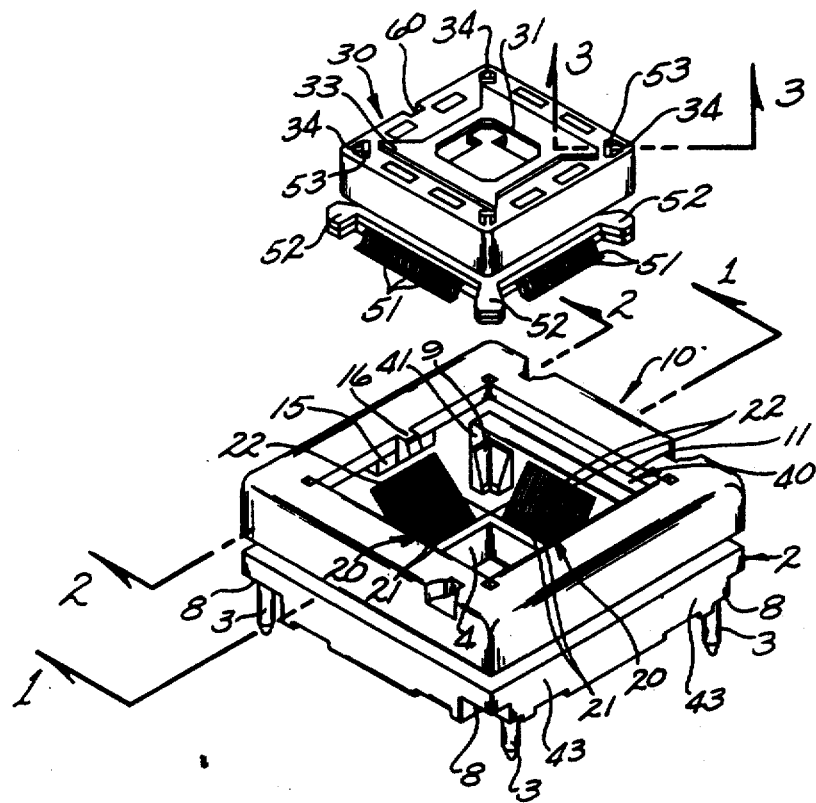
FIG. 4 is a perspective view illustrating insertion of an IC unit in a chip carrier into the main body of the socket of this invention.
Figure 5:
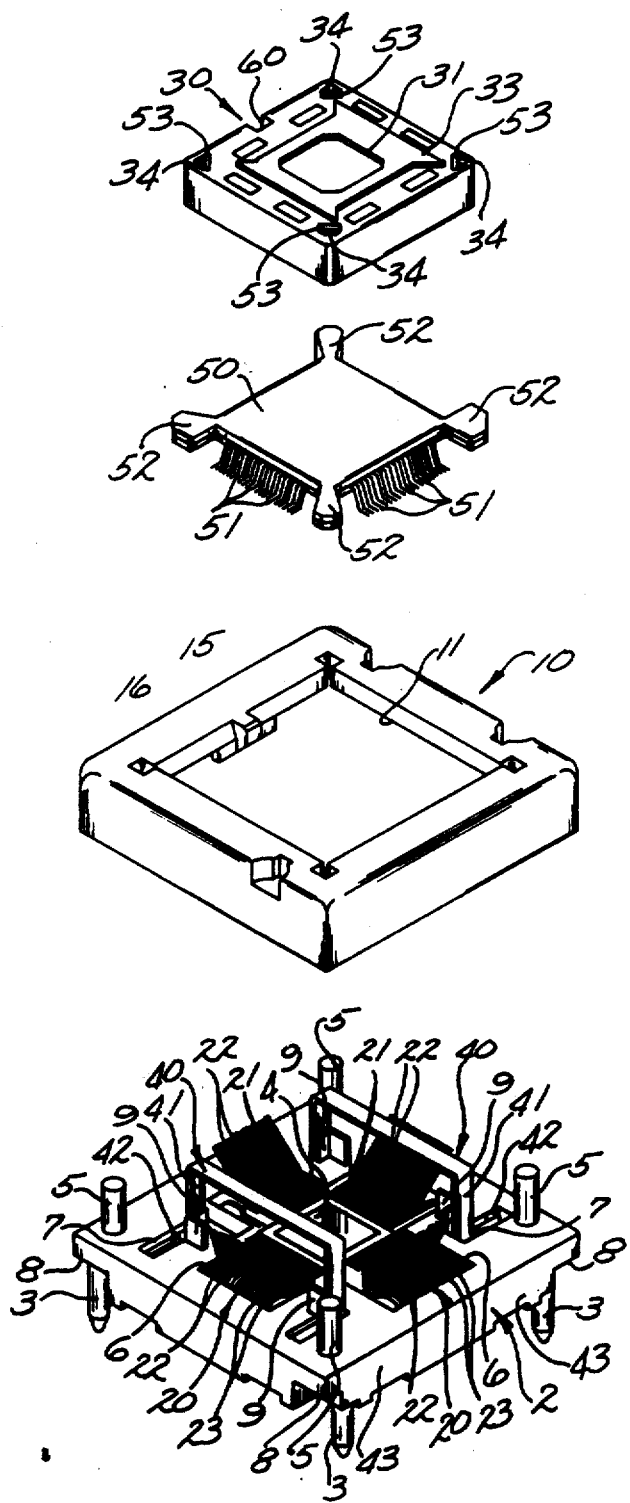
FIG. 5 is a perspective view similar to FIG. 4 illustrating assembling of the cover member of the socket on the socket body and of the IC unit in the chip carrier.

As shown, the carrier 30 supports an IC chip 50 and there is provided a groove 35 in the carrier for insertion of each of the leads 51 of the IC chip as shown in FIG. 3. In addition, there is provided the compressive detent part 34 that elastically compresses and holds the protuberant parts 52 of the IC unit that are provided at four corners of the IC chip 50. (In the case of this example, these are provided at four locations as shown in FIGS. 4 and 5.)

Reference numeral 31 in the drawings (see FIG. 1) indicates a through hole in the carrier, 32 is an inclined surface around the hole 31, 33 is a groove which has been provided around the through hole 31 at the top of the carrier 30, and 53 are through holes in the carrier for insertion of protuberant parts 52 of the IC chip 50.

The aforementioned constituent parts including the contact element 20, fixing member 40, main socket body 2, cover part 10 and the carrier 30 (on which the IC chip 50 is provided) are preferably comprised in the socket 1 of the invention.

As is shown in FIG. 1, the IC chip 50 along with the carrier 30 are held by and fixed to the main socket body 2 between and by means of fixing or holding members 40 (the lever 41) and by the contact elements 20 (the compressive parts 21).

FIG. 4 is a perspective view showing the state in which the IC chip 50 mounted in the carrier 30 is inserted into the main socket body 2 along a device insertion axis by the action as described below after the installation of the IC chip in the carrier 30 as shown in FIG. 5.

Figure 6:
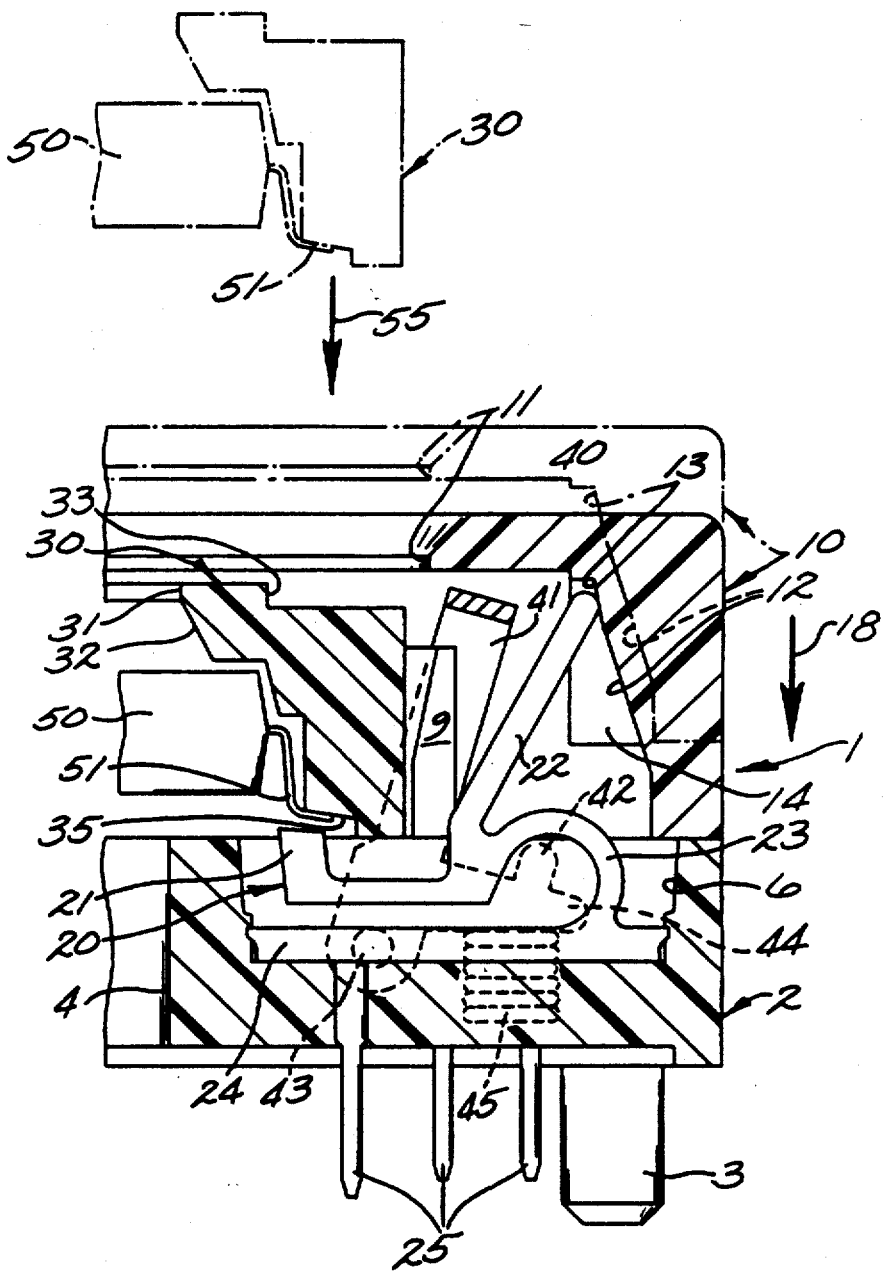
FIG. 6 is a partial section view similar to FIGS. 1 and 2 illustrating operation of the socket of this invention.

That is, as is shown in FIG. 6, the cover 10 that has been installed at a prescribed location on the main socket body 2 is adapted to be lowered or depressed in the direction indicated by an arrow 18 by an external force (including the force applied by the hand or by an automatic machine) from the imaginary or broken line position indicated in FIG. 6. As this occurs, the sliding or trigger parts 22 of the contact elements 20 are moved in the counterclockwise direction by sliding engagement with the inclined cover surfaces 12.

Simultaneous with the above, the compressive parts 21 of the contact elements likewise move in the same direction. In connection with this movement, a substantial force has to be used in order for the contact elements to be elastically deformed in this way.

As the cover part 10 is further lowered and, preferably at the time when the trigger parts 22 of the contact elements reach inclined surface 13 whose incline is greater than that of the inclined surfaces 12, the lower end portions of the cover part 10 contact the protuberant parts 42 of the fixed or holding members 40. As the cover part 10 is further moved downward in the direction indicated by arrow 18, the protuberant part 42 is compressed downward by the cover part 10 with the consequence that the fixing or holding lever 41 of the holding member 40 rotates in the clockwise direction (as shown in FIG. 1) in opposition to the force of the spring 45 with the pin 43 as the fulcrum. (In other words, the lever 41 opens in such a manner as to permit the insertion of the carrier 30 in the socket past the holding members 40.)

As the cover part 10 is pressed down until it contacts the main socket body 2, the fixing members 40 (lever 41) are brought into a satisfactorily open state. In other words, the cover position changes from what is indicated by the broken line in FIG. 6 to what is shown by a solid line. As a result of what has been described here, the members 40 move from the position shown in FIG. 1 to the position shown in FIG. 6. Further, the springs 45 which are fixed between the connective parts 44 of the holding members 40 and the main socket body 2 are brought into a compressed state as shown in FIG. 6.

As has been described above, the reaction force of the resilient contact elements 20 become less strong as the contact fingers 22 engage the inclined surfaces 13 as compared with the force (externally applied force) required to move the sliding parts 22 of the contact elements when they are first moved in the counterclockwise direction by engagement with the inclined surfaces 12. Therefore, the force required to move the cover becomes more nearly just that force which is necessary to push down the protuberant parts 42 of the holding members 40 in opposition to the spring force of the springs 45. Accordingly, a smaller compressive force will be required than if the springs 45 and contact elements 20 both had to be compressed at the same time. Therefore, operation can be carried out smoothly without employing a large force at that point by automatic equipment or the like in connection with this cover depressing action. If preferred, the inclined surface 13 may be a surface extending parallel to the direction of cover movement.

What is described above is smoothly achieved by selecting a timing between the action for moving the sliding part 22 of the contact elements 20 in a counterclockwise direction in the initial stage (with the sliding parts 22 sliding against the inclined surfaces 12) and the action for moving the protuberant parts 42 of the fixing members 40 in the clockwise direction (by pressing down) in the subsequent stage (with the sliding part 22 sliding against the inclined surfaces 13 with or without the sliding part 22 undergoing additional shifting).

With the fixed member 40 (lever 41) in a satisfactorily open state as described above, the IC chip 50 that has been provided on the carrier 30 beforehand is inserted through the hole 11 of the cover part 10 in the direction shown by an arrow 55 in FIG. 6 so the IC chip 50 is disposed in a prescribed location in the main socket body 2 with the IC terminals 51 aligned with contact element portions 21.

When, thereafter, the force pressing down the cover part 10 (external force) is released, the holding members 40 and contact elements 20 and the cover part 10 move in the direction opposite the aforementioned direction (direction for the restoration to the original position).

In other words, the fixing lever 41 rotates in the counterclock-wise direction (as viewed in FIG. 1) by the restoring force of the spring 45 which is in a compressed state, thereby being restored to their original position, and the cover 10 is pushed back to its original location (back motion) by the elastic restorative force of the contact elements 20 that work on the cover via the sliding parts 22 of the contact elements 20.

Because of the above, the fixing member 40 and the contact elements 20 are pushed back to their original locations, thereby being restored to the state shown in FIG. 1. At this juncture, there is a gap "d" preferably in a range between approximately 0.15 and 0.20 millimeters between the bottom of the carrier 30 and the main socket body 2 and the IC chip in its carrier is in the state of being resiliently afloat above the main socket body 2.

Therefore it becomes possible to fix the IC chip (and the carrier 30) to the main socket body in a manner making the contact pressure of the contact elements 20 on the IC leads 51 just sufficient for the desired test purposes.

As has been explained above, it becomes possible according to the socket of this invention to shift the holding members 40 and the contact elements 20 from the original positions in connection with the downward movement (forward motion) of the cover part 10 by an externally applied force (pushing-down force), thereby inserting the IC chip 50 that has been installed on the carrier 30 into the main socket body 2, and to return the fixing members 40 and the contact elements 20 to their original positions respectively, thereby effecting the fixing of the IC chip 50 to the main socket body 2 and the movement (back motion) of the cover part 10 to its original location site.

Accordingly, it is possible to fix the IC chip 50 to the main socket body 2 by a basically simple action involving the reciprocating motion (up and down motion in this example) of the cover part 10.

Since it is not necessary to employ such complicated operation as has been employed in the past, it becomes possible to easily insert the IC chip 50 into the main socket body in an easily detachable fashion even by using an automatic machine, etc. This will be highly advantageous from the standpoint of accelerating automation of testing.

Since, the structure does not require any separate movement of a latch as in conventional techniques, a miniaturization of the socket is also easily achieved.

Figure 7:
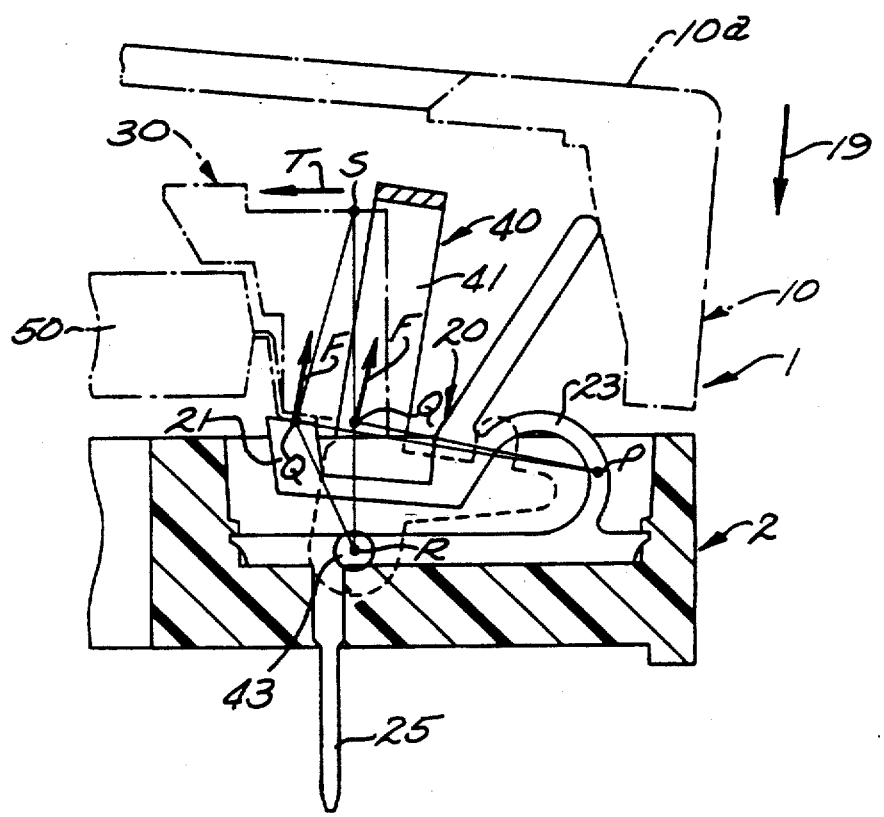
FIG. 7 is a somewhat diagrammatic view similar to FIG. 6 illustrating performance characteristics of the socket of the invention.

Referring to FIG. 7, where the IC chip 50 installed in the carrier 30 is to be removed from the socket, it will be seen that, if an external force is applied against the cover 10 in the direction indicated by an arrow 19 in a locally biased manner on a side of the member, the cover tends to tilt from the horizontal state to an extent permitted by the pins 5 as indicated in somewhat exaggerated form at 10a, with a consequence that the holding members 40 tend to enter the state which is immediately ahead of their disengagement from the carrier 30.

That is, there is produced a revolving moment of force F having point P shown in FIG. 7 of the bent part 23 of the contact element 20 as the fulcrum tending to cause the carrier 30 to rise. It is conceivable, therefore, that the carrier 30 may become unstable, causing a positional shift such as the elevation of one side of the carrier 30. In such a case, however, the aforementioned positional shift is prevented and the reliability of the socket is improved where the compressed part 21 of the contact element 20 as indicated at Q is on a straight vertical line which connects the center R of the fulcrum pin 43 with the compressive point S of the holding member 40 in the desired level state of the carrier 30 or is within a prescribed distance in the direction T from that vertical line.

That is, a preferred effect such as has been described is achieved by selecting the position of the holding members 40 to cause the points R and S to be located on the perpendicular line including the above location Q.

In that way, if the distance between the fulcrum P of the contact element 20 and the point Q on the compressive part 21 becomes longer as compared with the case where the compressive point Q is located on the straight line connecting the aforementioned two points R and S, a greater moment is received with a result that the carrier 30 received a strong upward moment in connection with the dismantling of the carrier 30, thereby causing a positional shift, etc.

In FIG. 7, only the major reference numerals are shown with the other numerals being omitted since they are the same as in the other figures.

Other structural features of the main socket body 2 and the carrier 30 are as follows:

(1) As is shown in FIGS. 4 and 5, cut parts 8 are provided at four corners of the bottom of the main socket body 2. Therefore, operation can be effected easily even by hand, provided that suitably designed tools, etc. are employed.

(2) As is shown in FIGS. 4 and 5, there is provided a groove 33 around the top of the carrier 30, with the result that it becomes possible to pile or stack the carriers in nested relation up and down. This is convenient particularly in the case where an automatic machine is employed where it will facilitate automation.

(3) In the carrier 30, there is provided an inclined surface 32 along the through hole 31 at the part of said through hole as shown in FIGS. 1 and 3 with a result that removal of the IC chip 50 from the carrier 30 can be effected by engaging the inclined surface 32 by means of a prescribed tool or the like. Accordingly, the operation for dismantling of the carrier 30 can also be carried out easily.

Ordinarily the carrier 30 and the IC chip 50 are supplied separately to the user. As shown in FIG. 3, however, the carrier 30 and the IC chip 50 can be supplied in an attached or integrated state with the carrier. Therefore this means that protection of the IC chip will occur during the course of transporation, for example.

It has not been practiced in the past to supply the carrier and IC chip in such an integrated state to the user. On the other hand, operation of soldering the IC chip to the printed circuit substrate is a difficult one in the case where the supply of the IC chips may have been delayed with a consequent time loss becoming a serious problem in testing. If a socket has been constituted in the manner as described above, it is only necessary to install the main socket body to the printed base board circuit by soldering followed by fixing of the carrier that has been furnished with the IC chip installed as described above on the main socket body. In this manner, the troublesome soldering operation by the user becomes unnecessary. Moreover, the same can be installed on the printed base circuit board in a short period of time by a simple operation where it is supplied by the socket manufacturer.

This invention has been explained above on the basis of some examples. It is mentioned in this connection that the above-described examples can be further modified on the basis of the technical concept of the invention.

For example, the shape, material and the installation position, etc. of the contact elements or fixed members as described above can be modified in a number of ways. In addition, the shape, material, structure of the cover part (reciprocating motion member) and the angle of its inclined surface can be changed.

In addition, the materials, shapes and structures of the main socket body and the carrier can also be modified within the scope of the invention.

Moreover, it is not necessarily required that the IC chip be mounted on the carrier. That is, the carrier is adapted to be omitted if desired and the IC unit is inserted directly into the socket without the carrier within the scope of the invention.

In the above examples, the IC chip was inserted and held inside the main socket body by moving the cover part in the vertical direction. However, the same can also be achieved by shifting in any suitable direction including the horizontal direction if desired.

The timing of the holding of IC chip and the restoration of the cover part to the original location may be sequential or may be simultaneous as preferred.

In addition, the shape of the spring that is installed between the fixed member and the main socket body and the method for its installation can be modified. Also this invention can of course be applied to electrical devices or parts other than the aforementioned IC chips.

We claim:

1. A socket comprising a body, a plurality of contact elements on the body to be electrically connected in an elastically compressed state with respective terminals of an electrical device, a pair of holding members on the body for detachably locating the electrical device relative to the body, and a reciprocating member mounted for reciprocating movement relative to the body for moving the contact elements and holding members from original positions thereof to receive insertion of the electrical device into the socket and permitting the reciprocating member and the contact elements and holding members to thereafter return to their original positions to hold the electrical device in a selected position with the contact elements engaging respective device terminals, the contact elements being resilient to be movable from their original positions to receive insertion of the electrical device in response to movement of the reciprocating member in a first direction and for biasing the reciprocating member to move in an opposite direction to return to its original position after insertion of the electrical device, the holding members being pivotally mounted on the body to be engaged by the reciprocating member and rotated from their original positions in response to movement of the reciprocating member in said first direction to receive insertion of the electrical device, and means bias the holding members to return to their original positions for holding the electrical device in said selected position when the reciprocating member is moved in said opposite direction said contact elements being disposed around an electrical device insertion axis to electrically engage respective device terminals disposed around a device periphery, and having the pair of said holding members pivotally mounted on the body to be pivoted from their original positions away from each other in response to movement of the reciprocating member in said first direction to receive insertion of the electrical device therebetween along said device insertion axis, the means biasing the holding members to return to their original positions being arranged to return the holding members to their original positions to define a position for the electrical device in the socket, and the contact elements being adapted to resiliently engage the respective device terminals and the reciprocating member for resiliently supporting the device in said device position and for moving the reciprocating member in said opposite direction to its original position.

2. A socket according to claim 1 wherein movement of the reciprocating member in aid first direction initially moves the contact elements from their original positions and subsequently moves the holding members from their original positions, and movement of the reciprocating member in said first direction completes movement of the contact elements from their original positions before thereafter moving the holding members from their original positions for separating the forces required to move the contact elements and holding members.

3. A socket the holding members being pivotally mounted on the body to be engaged by the reciprocating member and rotated from their original positions in response to movement of the reciprocating member in said first direction to receive insertion of the electrical device, and means bias the holding members to retain to their original positions for holding the electrical device in said selected position when the reciprocating member is moved in said opposite direction, movement of the reciprocating member in said first direction initially moving the contact elements from their original positions and subsequently moving the holding members from their original positions, said contact elements being disposed around an electrical device insertion axis to electrically engage respective device terminals disposed around a device periphery, and having a pair of said holding members pivotally mounted on the body to be pivoted from their original positions away from each other in response to movement of the reciprocating member in said first direction to receive insertion of the electrical device therebetween along said device insertion axis, the means biasing the holding members to return to their original positions being arranged to return the holding members to their original positions to define a position for the electrical device in the socket, and the contact elements being adapted to resiliently engage the respective device terminals and the reciprocating member for resiliently supporting the device in said device position and for moving the reciprocating member in said opposite direction to its original position.

4. A socket according to claim 3 wherein each holding member is of substantially U-shape having distal ends of legs of the U-shape pivotally mounted on the body, a base of the U-shape of each holding member being movable over the electrical device for detachably defining the device position in the socket.

5. A socket according to claim 4 wherein contact elements engage electrical device terminals at locations falling on a line between the pivotal mounting of the holding member and the location where each holding member engages the electrical device for defining the device position in the socket for protecting the integrated circuit unit during insertion of the electrical device.

6. A socket according to claim 4 wherein each contact element comprises a fixed part secured to the body, a resilient arc portion attached at one end of the arc to the fixed contact part and having an opposite end of the arc portion adapted to resiliently engage a device terminal, and a trigger part slidably engagable with the reciprocating member for moving the contact elements from their original position in response to movement of the reciprocating member in said first direction and for thereafter biasing the reciprocating member to return to its original position.

7. A socket according to claim 6 having a carrier for receiving an electrical device therein to protect the device during insertion into the socket.

8. A socket according to claim 7 wherein the electrical device comprises an integrated circuit unit detachably held in a carrier.

9. A socket according to claim 6 wherein the electrical device comprises an integrated circuit unit having a carrier receiving the integrated circuit unit therein for protecting the integrated circuit unit during insertion of an electrical device into the socket.

10. A socket according to claim 9 wherein the carrier has a bottom opening for receiving an integrated circuit unit therein and has a groove around the periphery defining a top boss portion of the carrier to be nested in the bottom opening of a corresponding carrier during handling of a plurality of said carriers.

11. A test socket system comprising a socket having a body, a contact element on the body to be electrically connected in an elastically compressed state with a terminal of an electrical device, a holding member on the body for detachably locating the electrical device relative to the body, and a reciprocating member mounted for reciprocating movement relative to the body for moving the contact element and holding member from original positions thereof to receive insertion of the electrical device into the socket and permitting the member and the contact element and holding member to thereafter return to their original positions to hold the electrical device in a selected position with the contact element engaging a device terminal, the electrical device comprising an integrated circuit unit having a carrier receiving the integrated circuit unit therein for protecting the integrated circuit unit during insertion of the electrical device into the socket, and the socket body being mounted on a substrate, having a test circuit provided on the substrate, and having said contact element electrically connected in the test circuit.

* * * * *